United States Patent

[11] 3,631,262

[72] Inventor Robert J. Jarrett
Shelburne, Vt.
[21] Appl. No. 24,132
[22] Filed Mar. 31, 1970
[45] Patented Dec. 28, 1971
[73] Assignee General Electric Company

[54] LINEAR VARIABLE GAIN CIRCUIT UTILIZING A FIELD EFFECT TRANSISTOR
9 Claims, 3 Drawing Figs.

[52] U.S. Cl. .......... 307/229, 328/160, 328/161, 330/29, 330/85, 330/86, 330/145
[51] Int. Cl. .......... G06g 7/16
[50] Field of Search .......... 330/29, 35, 85, 86, 145; 307/229, 230; 328/160, 161; 235/194, 196

[56] References Cited

UNITED STATES PATENTS 3,514,700 5/1970 Kalin et al. .......... 328/161 X

*Primary Examiner*—Roy Lake
*Assistant Examiner*—James B. Mullins

*Attorneys*—Bailin L. Kuch, Irving M. Freedman, Harry C. Burgess, Frank L. Neuhauser, Oscar B. Waddell and Joseph B. Forman

ABSTRACT: A linear variable gain circuit which uses a field effect transistor as one branch of two voltage divider networks. The drain terminal of the FET is the midpoint of both voltage divider networks. One of the voltage divider networks is comprised of a resistor and the FET coupled in series with a regulated voltage supply, and the other voltage divider network is comprised of a resistor which is capacitively fed with the relatively AC signal input, and the FET. The signal from the drain terminal of the FET, which is comprised of a relatively DC voltage level and a relatively AC voltage level, and which are responsive to the drain to source resistance of the FET, is fed back as one input to a differential operational amplifier. The other input to the DOA is a relatively DC control signal, in response to which the gain of the circuit is to vary. An AC feedback loop is also provided around the DOA. The DC voltage on the two inputs are compared by the DOA and any DC difference is passed, via a decoupling network, to the gate terminal of the FET to vary the value of its drain to source resistance. The AC signal from the drain terminal at the DOA input is amplified and taken from the DOA output via a capacitor.

PATENTED DEC 28 1971 3,631,262

INVENTOR:
ROBERT J. JARRETT,

BY [signature]

HIS ATTORNEY.

LINEAR VARIABLE GAIN CIRCUIT UTILIZING A FIELD EFFECT TRANSISTOR

BACKGROUND OF THE INVENTION

1. Field of Use

This invention relates to variable gain circuits and especially to such a circuit utilizing a field effect transistor and having a linear relationship between the input control signal and the gain of the circuit.

2. Prior Art

It has been known, as shown in U.S. Pat. No. 3,368,157, that the resistance of a field effect transistor may be varied by a control voltage, but not linearly with the control voltage. It has also been known, as shown in U.S. Pat. Nos. 3,131,312 and 3,213,299, to linearize the resistance of a field effect transistor by utilizing a voltage divider placed across the drain and source terminals of the FET with a control voltage connected between the midpoint of the divider and the gate terminal, but the resistance of the FET does not vary linearly with the control voltage.

SUMMARY OF THE INVENTION

Accordingly, it is an object of this invention to provide a scheme for varying the resistance of a field effect transistor linearly with a control voltage.

It is a further object to provide a linear variable gain circuit of relatively simple and economical design.

A feature of this invention is the provision of a linear variable gain circuit which uses a field effect transistor as one branch of two voltage divider networks. The drain terminal of the FET is the midpoint of both voltage divider networks. One of the voltage divider networks is comprised of a resistor and the FET coupled in series with a regulated voltage supply, and the other voltage divider network is comprised of a resistor which is capacitively fed with the (relatively) AC signal input, and the FET. The signal from the drain terminal of the FET, which is comprised of a (relatively) DC voltage level and a relatively AC voltage level, and which are responsive to the drain to source resistance of the FET, is fed back as one input to a differential operational amplifier. The other input to the DOA is a relatively DC control signal, in response to which the gain of the circuit is to vary. An AC feedback loop is also provided around the DOA. The DC voltage on the two inputs are compared by the DOA and any DC difference is passed, via a decoupling network, to the gate terminal of the FET to vary the value of its drain to source resistance. The AC signal from the drain terminal at the DOA input is amplified and taken from the DOA output via a capacitor.

BRIEF DESCRIPTION OF THE DRAWING

These and other objects features and advantages will be apparent from the following specification of the invention taken in conjunction with the accompanying drawing in which.

DESCRIPTION OF THE INVENTION

It is well known that the drain to source resistance of a field effect transistor can be varied as a function of the applied gate to source voltage. It can be seen from the drain characteristic curves of an exemplary FET shown in FIG. 2, that if the drain to source voltage and the drain to current are kept low, the device looks like a substantially linear resistance between the drain and source, i.e., the drain-to-source voltage varies linearly with the drain current. However, the slope of the curves which represents the drain-to-source resistance is not a perfectly linear function of the gate-to-source voltage. Therefore, a circuit is required to force the drain-to-source resistance to vary linearly with the control signal.

Figure 1:
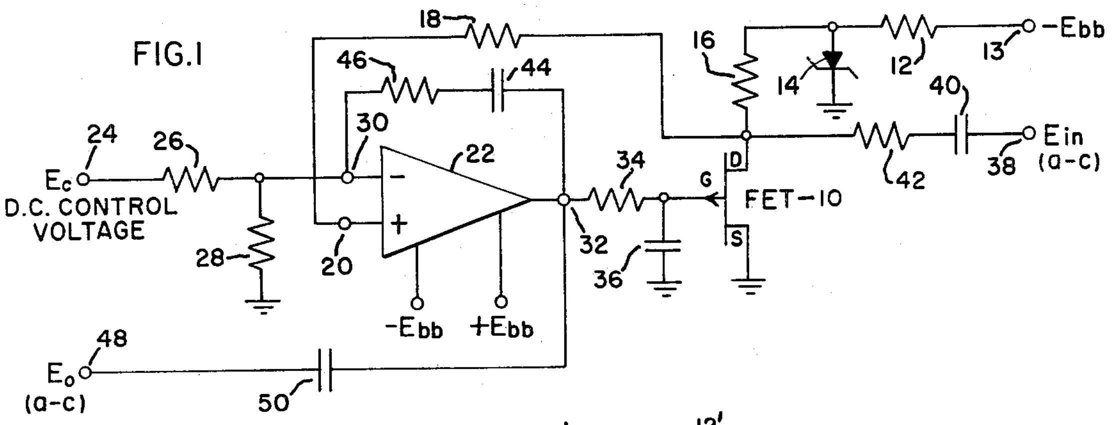
FIG. 1 is a schematic of a modulator embodying this invention.

Such a circuit is shown in FIG. 1. A field effect transistor 10 has drain, gate and source terminals, and is coupled in series with a regulated DC voltage supply provided by a resistor 12 coupled to the DC supply voltage terminal 13 and a voltage regulator diode 14 coupled to ground, through a resistor 16. The resistor 16 is used to provide a constant DC current into the drain of the FET. This produces a DC voltage drop across the FET which is proportional to the drain-to-source resistance. This voltage at the drain is also fed back via a resistor 18 to a first input terminal 20 of a differential operational amplifier 22. A control signal $E_c$ is provided at input terminal 24 and is coupled through a voltage divider provided by resistors 26 and 28 to a second input terminal 30 of the DOA 22. The resistors 26 and 28 form a voltage divider to reduce the control voltage down to the desired low range of the DC voltage across the FET drain to source. The DOA compares the voltages at its two input terminals and provides a difference signal at its output terminal 32, whose low-frequency component is passed, through a decoupling network provided by resistor 34 and capacitor 36, to the gate terminal of the FET. This gate signal is of such a polarity as to drive the drain-to-source resistance in the proper direction to decrease the difference between the input control voltage $E_c$ and the drain-to-source voltage $E_{ds}$. Since the DC current into the drain is constant and the drain-to-source voltage is proportional to the input control voltage, the drain-to-source resistance $R_{ds}$ must be proportional to the input control voltage. This variable resistance $R_{ds}$ can be used as part of a voltage divider to control the gain applied to an input AC signal. An input AC signal terminal 38 is coupled via a capacitor 40 and a resistor 42 to the FET drain. The resistor 42 is used to provide an AC current into the FET drain which is proportional to the input signal $E_{in}$ at the terminal 38. The resistance of resistor 42 must be large compared to the drain-to-source resistance. The AC current is coupled by the capacitor 40 which must have an impedance at the signal frequency which is small compared to the resistance of the resistor 42.

The DOA 22, in addition to being used to control the drain-to-source resistance, is also used to amplify the input AC signal. Since the input AC current is proportional to the input AC signal $E_{in}$, the AC voltage across the drain-to-source resistance is proportional to $E_{in}$ in addition to the control voltage $E_c$. This AC voltage is fed back to the input terminal 20 of the DOA via the resistor 18. An AC feedback network consisting of a capacitor 44 and a resistor 46 is coupled between the DOA output terminal 32 and the DOA input terminal 30, and in conjunction with the resistor 28 sets and stabilizes the AC gain through the DOA so that the AC output voltage is proportional to $E_{in}$ and is also proportional to $E_c$. The impedances of capacitor 44 is small compared to that of resistor 46 at the signal frequency and, therefore, acts only as a coupling capacitor and has little effect on the gain. The decoupling network consisting of the resistor 34 and the capacitor 36 attenuates the signal frequency and prevents AC feedback through the FET. The resistance of the resistor 34 can be large without appreciably affecting the DC gain because of the very high input impedance to the gate of the FET. This allows the capacitance of capacitor 36 to be small and also minimizes loading on the DOA. The DOA output terminal 32 is coupled to the output signal terminal 48 by a capacitor 50 which must have a low impedance compared to that of the load at the output terminal 48 at the signal frequency. The resistance of the resistor 18 is such as to balance the DC impedance on the two DOA inputs to minimize DC drift which could act as a false control voltage input.

Figures 2, 3:
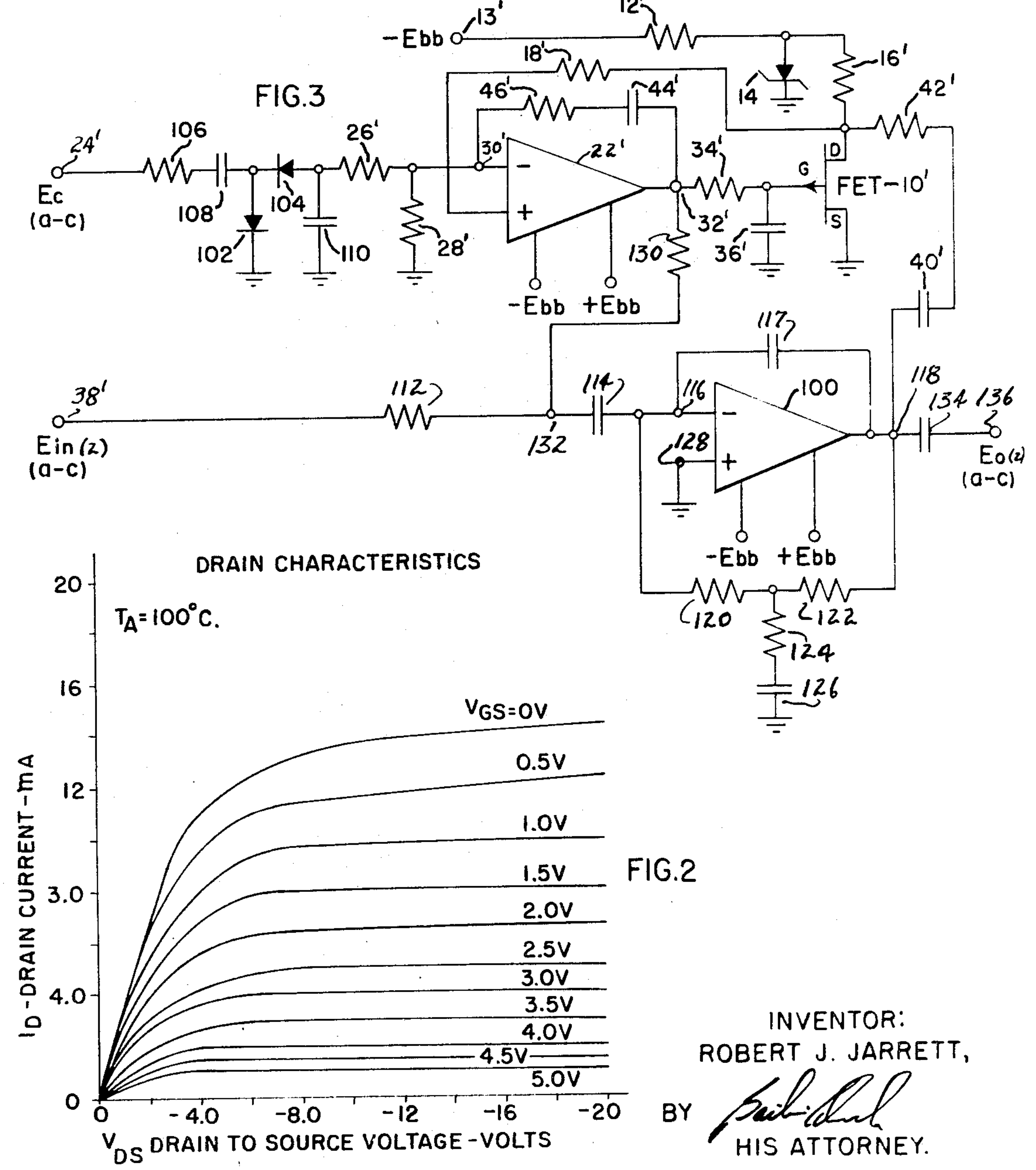
FIG. 2 is a diagram of the drain characteristics of a representative field effect transistor.
FIG. 3 is a schematic of a divider incorporating the modulator of FIG. 1.

It will thus be seen that a DOA and negative feedback have been used to force the resistance of a FET to be proportional to a DC control voltage. This same resistance is then used as part of the voltage divider to control the gain of an AC signal. The same DOA is then used to amplify the AC signal and bring it to a suitable voltage level. The circuit thus performs the basic multiplication function in a simple manner with a few components so that $E_{out}=KE_{in}E_c$. The linearity of the circuit does not depend upon the linearity of the resistance of the FET as a function of the gate-to-source voltage. However, it does require that the resistance of the FET be linear at any particular control voltage. This characteristic does exist at low voltage and current levels, as seen in FIG. 2. The circuit can be used over a wide temperature range because it is not significantly affected by changes in amplifier or FET gain. The gain-controlling components are primarily resistors which are readily obtained with low temperature coefficients. Voltage or current drift in the DOA is important at the low voltage levels at which operation takes place, but stable, integrated circuit, DOAs are readily available.

It will be appreciated that the invention can be embodied in various forms. The field effect transistor can be either a P-channel or N-channel device by using the correct polarity of drain voltage and control voltage. The FET can also be of the depletion or enhancement type and/or MOS-type construction. The control signal can be either DC, as shown in FIG. 1, or, if an AC control signal is required, the AC can be rectified by a diode, filtered with a capacitor and then applied to the control unit. If the control signal is varying DC signal, i.e., contains an AC signal at a lower frequency than the input signal, in addition to the DC signal, then the circuit can be considered a modulator.

THe circuit may also be incorporated into a divider circuit, wherein it is placed in the feedback of another DOA 100, as shown in FIG. 3. Here the control voltage $E_c$ is an AC signal applied to input terminal 24, which is then rectified and filtered by a network including diodes 102, 104, resistor 106, and capacitors 108, 110. The remaining parts of the circuit which are identical to the circuit shown in FIG. 1 are provided with primed reference numerals. The more rapidly varying input AC signal is applied to the input terminal 38′ , which is coupled via an AC gain set resistor 112 and an AC coupling capacitor 114 to one input terminal 116 of the DOA 100. The input terminal 116 and the output terminal 118 of the DOA 100 are coupled by an AC feedback capacitor 117 and are coupled via a T-network consisting of a resistor 120, a resistor 122, a resistor 134 and a capacitor 126 to ground, which serves to set and stabilize the DC and AC gain of the DOA 100. The other input terminal 128 of the DOA 160 is connected to ground. The output terminal 118 of DOA 100 is coupled via the capacitor 40′ through the resistor 42′ to the drain terminal of the FET′ . The output terminal 32′ of the DOA 22′ is coupled via a feedback gain-setting resistor 130 to a summing point 132 between the resistor 112 and the capacitor 114. The output terminal 118 is coupled by an AC coupling capacitor 134 to the output signal terminal 136.

It will be appreciated that the signal relationships of the multiplier of FIG. 1 are $E_{out}(1)/E_{in}(1)=K E=$ gain of the multiplier.

The signal relationships of the divider of FIG. 3 utilizing the multiplier of FIG. 1 in feedback are $K_1E_c=G_{fb}$.
$E_{out}(2)/E_{in}(2)=1/R$(resistor 112) $\times 1/G_{fb}=1/R_{in}\times 1/K_1E_c$. And $$E_{out}(2)=K_2/E_{in}(2)\ E_c.$$

While there have been shown and described the preferred embodiments of the invention, it will be understood that the invention may be embodied otherwise than as herein specifically illustrated or described, and that certain changes in the form and arrangement of parts and in the specific manner of practicing the invention may be made without departing from the underlying idea or principles of this invention within the scope of the appended claims.

What is claimed is:

1. A circuit for multiplying a first, relatively slowly changing voltage signal by a second, relatively rapidly changing signal comprising:
  - a field effect transistor having drain, gate and source terminals;
  - said drain and source terminals being coupled in series with a source of constant current;
  - an input terminal coupled to said drain terminal for receiving said second signal;
  - a DC amplifier having input means for receiving said first signal and an output means coupled to said FET gate terminal for providing a no more than relatively slowly changing current thereinto;
  - control signal feedback means coupled between said FET drain terminal said DC amplifier input means; and
  - stabilization signal feedback means coupled between said DC amplifier output means and input means.

2. A circuit according to claim 1 wherein:
  - said DC amplifier is a differential operational amplifier having first and second input terminals and an output terminal,
  - said first input terminal is adapted to receive said first, relatively slowly changing signal, and
  - said second input terminal is coupled to said control signal feedback means.

3. A circuit according to claim 1 wherein:
  - said stabilization signal feedback means is an AC coupling network between said DC amplifier output and input means.

4. A circuit according to claim 1 wherein:
  - an AC decoupling network couples said FET gate terminal to said DC amplifier output means.

5. A circuit for dividing a first relatively rapidly changing voltage signal by a second relatively slowly changing signal comprising:
  - a DC amplifier having input means for receiving said first signal and an output means; and
  - feedback means coupled between said output means and said input means of said DC amplifier comprising:
  - a field effect transistor having drain, gate and source terminals,
  - said drain and source terminals being coupled in series with a source of constant current,
  - said output means of said DC amplifier being coupled to said drain terminal,
  - an additional DC amplifier having input means for receiving said second signal and output means coupled to said FET gate terminal for providing a no more than relatively slowly changing current thereto, and coupled to said input means of said first mentioned DC amplifier,
  - control signal feedback means coupled between said FET drain terminal and said additional DC amplifier input means; and
  - stabilization signal feedback means coupled between said additional DC amplifier output means and input means.

6. A circuit according to claim 2 wherein:
  - said first-mentioned DC amplifier is a differential operational amplifier having first and second input terminals and an output terminal,
  - said first input terminal is adapted to receive said first relatively rapidly changing signal, and
  - said second input terminal is coupled to said control signal feedback means.

7. A circuit according to claim 5 wherein:
  - said additional DC amplifier is a differential operational amplifier having first and second input terminals and an output terminal,
  - said additional DC amplifier first input terminal being adapted to receive said second, relatively slowly changing signal and coupled by an AC coupling network to said additional DC amplifier output terminal,
  - said first-mentioned DC amplifier output terminal being coupled to said drain terminal by an AC coupling network.

8. A circuit according to claim 5 wherein:
  - said stabilization signal feedback means is an AC coupling network between said additional DC amplifier output and input means.

9. A circuit according to claim 5 wherein:
  - said stabilization signal feedback means is an AC coupling network between said additional DC amplifier output and input means.